(12) United States Patent
Nishijima et al.

(10) Patent No.: US 8,053,086 B2
(45) Date of Patent: Nov. 8, 2011

(54) ENCAPSULATING MATERIAL FOR SOLAR CELL

(75) Inventors: Koichi Nishijima, Ichihara (JP); Kenji Miharu, Chuou-ku (JP)

(73) Assignee: Du Pont-Mitsui Polychemicals Co., Ltd., Minato-Ku, Tokyo (JP)

( * ) Notice: Subject to any disclaimer, the term of this patent is extended or adjusted under 35 U.S.C. 154(b) by 751 days.

(21) Appl. No.: 11/885,933

(22) PCT Filed: Mar. 8, 2006

(86) PCT No.: PCT/JP2006/304449
§ 371 (c)(1),
(2), (4) Date: Sep. 7, 2007

(87) PCT Pub. No.: WO2006/095762
PCT Pub. Date: Sep. 14, 2006

(65) Prior Publication Data
US 2009/0120489 A1 May 14, 2009

(30) Foreign Application Priority Data

Mar. 8, 2005 (JP) ................................. 2005-064266
Mar. 8, 2005 (JP) ................................. 2005-064267
Mar. 8, 2005 (JP) ................................. 2005-064268

(51) Int. Cl.
*H02N 6/00* (2006.01)
(52) U.S. Cl. .................... 428/516; 136/251; 428/515
(58) Field of Classification Search .................. 428/515, 428/516
See application file for complete search history.

(56) References Cited

U.S. PATENT DOCUMENTS

| | | | |
|---|---|---|---|
| 4,692,557 A | | 9/1987 | Samuelson et al. |
| 5,650,019 A | * | 7/1997 | Yamada et al. ............... 136/251 |
| 6,187,448 B1 | | 2/2001 | Hanoka et al. |
| 6,432,522 B1 | | 8/2002 | Friedman et al. |
| 2002/0179139 A1 | | 12/2002 | Hashimoto et al. |
| 2003/0029493 A1 | * | 2/2003 | Plessing ........................ 136/251 |
| 2003/0075210 A1 | | 4/2003 | Stollwerck et al. |
| 2004/0158000 A1 | * | 8/2004 | Yada et al. .................... 525/240 |
| 2004/0210012 A1 | * | 10/2004 | Jaaskelainen et al. .......... 526/65 |
| 2004/0216778 A1 | * | 11/2004 | Ferri et al. .................... 136/251 |

FOREIGN PATENT DOCUMENTS

| | | |
|---|---|---|
| CN | 1030142 A | 1/1991 |
| CN | 1116458 A | 2/1996 |
| JP | 58-023870 | 2/1983 |
| JP | 2-40709 B2 | 9/1990 |
| JP | 2000-091611 A | 3/2000 |
| JP | 2000-186114 A | 7/2000 |
| JP | 2001-89616 | 4/2001 |
| JP | 2001-119047 A | 4/2001 |
| JP | 2001-144313 | 5/2001 |
| JP | 2001-326374 A | 11/2001 |
| JP | 2002-231990 A | 8/2002 |
| JP | 2002-270881 A | 9/2002 |
| JP | 2003-046104 A | 2/2003 |
| JP | 2003-049004 A | 2/2003 |
| JP | 2003-188402 A | 7/2003 |
| JP | 2004-031445 A | 1/2004 |
| JP | 2005-019975 A | 1/2005 |

OTHER PUBLICATIONS

Machine Translation and Abstract of JP 2004/031445, Suzuki, Jan. 2004.*
Machine Translation and Abstract of JP 2001-335665, Hayashi Dec. 2001.*
Office Action issued in corresponding Japanese Patent Application No. 2007-507143.
Supplementary European Search Report issued Feb. 23, 2011 by the European Patent Office in corresponding EP Appln 06728768.0-2124.

* cited by examiner

*Primary Examiner* — Alicia Chevalier
*Assistant Examiner* — Ronak Patel
(74) *Attorney, Agent, or Firm* — Buchanan Ingersoll & Rooney PC

(57) ABSTRACT

An encapsulating material for solar cell containing a laminated adhesive and heat resistant layer (A) and a buffering layer (B), wherein a difference in flexural modulus between the heat resistant layer (A) and the buffering layer (B) is at least 30 MPa or more, is provided. The adhesive and heat resistant layer (A) is preferably an olefin polymer (a) having a melting point (according to JIS K7121) of 75° C. or higher and having a storage elastic modulus at 150° C. of $10^3$ Pa or more and the buffering layer (B) is preferably an olefin polymer (d) having a stiffness of 100 MPa or less. The encapsulating material for solar cell can provide superior transparency, flexibility, heat resistance and adhesiveness and can remarkably improve production efficiency of a solar cell module even when no organic peroxide is used. The encapsulating material can also exhibit a performance capable of corresponding to the thickness reduction of the solar cell element even when an organic peroxide is used. A solar cell module containing the encapsulating material is also provided.

13 Claims, No Drawings and packaged with an encapsulating material. Consequently, the encapsulating material for solar cell has been required to have a good transparency in order to obtain high power generation efficiency as well as superior adhesiveness to the protective materials and the solar cell element. Further, in order to avoid such troubles as flowing or deforming of the encapsulating material even when temperature rises during use of the solar cell module, it has been also required to have heat resistance. Further, in recent years, an encapsulating material more superior in flexibility has been required along with the thickness reduction of the solar cell element.

ENCAPSULATING MATERIAL FOR SOLAR CELL

TECHNICAL FIELD

The present invention relates to an encapsulating material for solar cell element in a solar cell module and a solar cell module using the same. In more detail, the present invention relates to an encapsulating material for solar cell, which is easy to form a solar cell module and superior in transparency, heat resistance, flexibility, adhesiveness and the like.

BACKGROUND ART

Hydraulic power generation, wind power generation and photovoltaic generation, which can improve environmental problems such as reduction of carbon dioxide and the like utilizing inexhaustible natural energy, are attracting attention. Among them, photovoltaic generation has been remarkably prevailing in recent years, because in addition to significant improvements in performances such as power generation efficiency of the solar cell module, reduction in cost have been progressed, and a project to facilitate introduction of a photovoltaic generation system for home use had been promoted by the government or municipalities. However, for further prevalence, further cost reduction is required, and therefore, a study aiming at further improvement in power generation efficiency has been continued night and day.

Solar cell module is generally the one in which a solar cell element such as silicon, gallium-arsenic, copper-indium-selenium and the like is protected with an upper transparent protective material and a lower substrate protective material, and the solar cell element and the protective material are fixed and packaged with an encapsulating material. Consequently, the encapsulating material for solar cell has been required to have a good transparency in order to obtain high power generation efficiency as well as superior adhesiveness to the protective materials and the solar cell element. Further, in order to avoid such troubles as flowing or deforming of the encapsulating material even when temperature rises during use of the solar cell module, it has been also required to have heat resistance. Further, in recent years, an encapsulating material more superior in flexibility has been required along with the thickness reduction of the solar cell element.

In addition, since semiconductor characteristics basically do not deteriorate although silicon cell is most expensive, there is a need to take out the silicon cell only from a module and reuse it when use of the module terminated or a malfunctioned member is exchanged in future. However, currently the encapsulating material has been cross-linked and cannot be removed even molten by heating. Further, it has become a problem that since a silane coupling agent has been added, strong adhesion between silicon cell and metal section makes difficult to separate them. Therefore, the encapsulating material is required to have a function to facilitate reuse of silicon cell Currently, as an encapsulating material for solar cell element in a solar cell module, ethylene-vinyl acetate copolymer with a high content of vinyl acetate is used from the view point of flexibility and transparency. However, due to its insufficient heat resistance, adhesive property and the like, an organic peroxide or a silane coupling agent had to be used in combination. For this reason, two steps process had to be employed in which a sheet of ethylene-vinyl acetate copolymer compounded with these additives was prepared in advance, then a solar cell element is encapsulated using the resultant sheet. In the step to manufacture this sheet, since low temperature molding was required to avoid decomposition of the organic peroxide, extrusion molding rate could not be increased. Further, in the encapsulation step for a solar cell element, an adhesion process comprising a temporary adhesion step taking a time of several to several ten minutes on a laminator and a real adhesion step taking a time of several ten minutes to 1 hour at a high temperature allowing an organic peroxide to decompose in an oven had to be carried out. Therefore, manufacturing of the solar cell module cost time and labor, and the encapsulating material had been one of the factors to increase its manufacturing cost. In addition, such encapsulating material could not satisfy the request for reuse of the solar cell element as described above.

Patent Literature 1: JP-B-2-40709

DISCLOSURE OF INVENTION

Problem to be Solved by the Invention

The present inventors have studied on an alternative material, which does not require use of such organic peroxide and can therefore remarkably improve production efficiency of the solar cell module, and also, has superior characteristics as an encapsulating material for solar cell. In addition, the inventors studied a way to obtain a high-performance encapsulating material for solar cell, which can sufficiently correspond to the thickness reduction of the solar cell element even in the case when an organic peroxide is used. As a result, the inventors have found that the laminated material described below is superior in transparency, flexibility and adhesiveness, and suitable to the alternative material, and accomplished the present invention.

Means for Solving Problem

Namely, the present invention relates to an encapsulating material for solar cell (an encapsulating material for solar cell element) wherein adhesive and heat resistant layer (A) and buffering layer (B) are laminated and a difference in stiffness between the adhesive and heat resistant layer (A) and the buffering layer (B) is at least 30 MPa or more.

The present invention provides, as an encapsulating material for solar cell, an encapsulating material for solar cell, wherein the adhesive and heat resistant layer (A) is composed of an olefin polymer (a) having a melting point (according to JIS K 7121-1987, DSC method) of 75° C. higher and a storage elastic modulus at 150° C. of $10^3$ Pa or more. The encapsulating material for solar cell, wherein a silane coupling agent is compounded in the olefin polymer (a), is a preferable embodiment.

The encapsulating material for solar cell, wherein said olefin polymer (a) is an ethylene-polar monomer copolymer (b), is a preferable embodiment. The encapsulating material for solar cell, wherein this ethylene-polar monomer copolymer (b) is an ethylene-unsaturated carboxylic acid copolymer having 4% by weight or more of content of unsaturated carboxylic acid unit or an ionomer thereof, is a more preferable embodiment.

The encapsulating material for solar cell, wherein said olefin polymer (a) is a crystalline or a low crystalline α-olefin polymer (c), is a preferable embodiment from the viewpoint of transparency.

The encapsulating material for solar cell, wherein said crystalline or low crystallinity α-olefin polymer (c) is a polymer or a copolymer of α-olefin having 2 to 10 carbon atoms and a degree of crystallinity as measured by X-ray is 5% or more, is a preferable embodiment. The encapsulating material for solar cell, wherein crystalline or low crystallinity α-olefin polymer (c) is a random copolymer of propylene and other α-olefin, is a more preferable embodiment.

In addition, the present invention provides, as an encapsulating material for solar cell, the encapsulating material for solar cell according to the above, wherein the buffering layer (B) is composed of an olefin polymer (d) having a stiffness of 100 MPa or less.

The encapsulating material for solar cell, wherein said olefin polymer (d) is an ethylene-vinyl acetate copolymer, an ethylene-unsaturated carboxylate ester copolymer, an ethylene-unsaturated acid copolymer or an ionomer thereof, and a resin composition (g) comprising 50 to 100 parts by weight of an amorphous α-olefin polymer (e) satisfying the following requirements (1) to (3):

(1) a content of polymerization unit based on α-olefin having 3 to 20 carbon atoms is 20 mole % or more;
(2) melting peak based on differential scanning calorimeter is not substantially observed;
(3) Mw/Mn is 5 or less;
and 50 to 0 part by weight of crystalline α-olefin polymer (f) (total of both polymers is 100 parts by weight), is a preferable embodiment thereof.

The encapsulating material for solar cell, wherein said olefin copolymer (d) is selected from an ethylene-vinyl acetate copolymer, an ethylene-unsaturated carboxylate ester copolymer, an ethylene-unsaturated acid copolymer or an ionomer thereof, and an amorphous or a low crystallinity α-olefin copolymer, is also a preferable embodiment thereof.

The encapsulating material for solar cell, wherein said olefin copolymer (d) is an ethylene-unsaturated carboxylate ester copolymer having a content of ethylene-unsaturated carboxylate ester unit of 10 to 40% by weight, and selected from ethylene-unsaturated carboxylate ester copolymers having a melting point (T° C.) (according to JIS K 7121-1987 or ISO 3146, DSC method) and a content (X mole %) of an ethylene-unsaturated carboxylate ester unit satisfying the following formula:

$$-3.0X+125 \geq T \geq 3.0X+109$$

is also a preferable embodiment thereof.

The encapsulating material for solar cell a, wherein said olefin copolymer (d) is composed of an olefin copolymer (d) containing a cross-linking agent, is a preferable embodiment.

The encapsulating material for solar cell, wherein said olefin copolymer (d) is composed of an olefin copolymer (d) containing a silane coupling agent, is also a preferable embodiment.

The present invention also provides a solar cell module comprising a solar cell element encapsulated with said encapsulating material for solar cell in such way that the adhesive and heat resistant layer (A) side and the buffering layer (B) side thereof are in contact with the protective material and the solar cell element, respectively. In this case, the solar cell module, wherein an adhesive strength between the adhesive and heat resistant layer (A) and the protective material is 3 N/10 mm or more, is a preferable embodiment.

Effect of the Invention

The encapsulating material of the present invention is superior in transparency, heat resistance, flexibility, adhesiveness and the like, and can be sufficiently used for a thin-walled solar cell element. Further, even when the solar cell module is in a condition of raised temperature during use, such trouble as flowing or deforming of the encapsulating material can be avoided, and therefore appearance of the solar cell is not impaired. Furthermore, in the formulation in which use of an organic peroxide is omitted, productivity in the manufacturing process of the solar cell module can be remarkably improved, and therefore production cost of the solar cell module can be drastically reduced. Still further, when use of the solar cell module using the encapsulating material of the present invention is terminated or a malfunctioned member is exchanged, a solar cell element can be easily separated from the module for reuse.

BEST MODE FOR CARRYING OUT THE INVENTION

The encapsulating material for solar cell of the present invention comprises an adhesive and heat resistant layer (A) and a buffering layer (B), and has a laminated structure in which a difference in stiffness between the adhesive and heat resistant layer (A) and the buffering layer (B) is at least 30 MPa or more.

[Adhesive and Heat Resistant Layer (A)]

The adhesive and heat resistant layer (A) in the encapsulating material of the present invention is composed of a material which does not easily deform at a high temperature as well as exhibits superior adhesiveness to a protective material such as glass, polycarbonate and acrylic resin, and in view of heat resistance, an olefin polymer (a) having a melting point (according to JIS K 7121-1987) of 75° C. or higher and a storage elastic modulus at 150° C. of $10^3$ Pa or more is preferably used. In particular, in view of productivity in manufacturing of the solar cell module, the former olefin polymer (a) is preferably used. The materials constructing the adhesive and heat resistant layer (A) preferably have a HAZE of 10% or less in a thickness of 0.5 mm.

In the olefin polymer (a) having a melting point (according to JIS K 7121-1987) of 75° C. or higher and a storage elastic modulus at 150° C. of $10^3$ Pa or more, a silane coupling agent is desirably compounded in order to enhance adhesiveness to the protective material such as glass, polycarbonate, acrylic resin, and the like. Examples of the silane coupling agent include a compound having hydrolysable group such as alkoxy group as well as an unsaturated group such as vinyl group, acryloxy group and methacryloxy group; amino group; and epoxy group and the like. As the silane coupling agent, specifically N-(β-aminoethyl)-γ-aminopropyltrimethoxysilane, N-(β-aminoethyl)-γ-aminopropylmethyldimethoxysilane, γ-aminopropyltriethoxysilane, γ-glycidoxypropyltrimethoxysilane, γ-methacryloxypropyltrimethoxysilane and the like can be exemplified. The silane coupling agent is desirably compounded in an amount of around 0.1 to 5 parts by weight relative to 100 parts by weight of the polymer component constructing the adhesive and heat resistant layer (A).

As the above olefin polymer (a), in view of transparency, an ethylene-polar monomer copolymer (b) having the above melting point and storage elastic modulus can be exemplified.

One of suitable examples of the ethylene-polar monomer copolymer (b) having a melting point (according to JIS K 7121-1987) of 75° C. or higher and a storage elastic modulus at 150° C. of $10^3$ Pa or more is an ethylene-unsaturated carboxylic acid copolymer having a content of unsaturated carboxylic acid unit of 4% by weight or more, and preferably 5 to 20% by weight, or an ionomer thereof, which has a melting point as measured by DSC of 75° C. or higher, preferably 85° C. or higher, and more preferably 90 to 110° C. As the ethylene-unsaturated carboxylic acid copolymer or ionomer thereof, in view of molding processability, mechanical strength and the like, the one having a melt flow rate at 190°

C. under a load of 2,160 g (JIS K7210-1999, hereinafter the same) of 0.1 to 100 g/10 minutes, in particular 0.5 to 50 g/10 minutes is preferably used.

Here, the unsaturated carboxylic acid includes acrylic acid, methacrylic acid, maleic acid, maleic anhydride and the like, and acrylic acid and methacrylic acid are particularly preferable. In addition, as a type of metal in the ionomer of ethylene-unsaturated carboxylic acid copolymer, an alkali metal such as lithium, sodium and the like; a polyvalent metal such as calcium, magnesium, zinc, aluminium and the like; and the like can be exemplified. Advantages in using these ionomers are high in transparency and storage elastic modulus at a high temperature. Among them, an ionomer or a blend of an ethylene-unsaturated carboxylic acid copolymer and an ionomer in which an average degree of neutralization is 1 to 30% is particularly preferable. Among the above ionomers or blends, in view of molding processability, mechanical strength and the like, the one having a melt flow rate at 190° C. under a load of 2,160 g (JIS K 7210-1999, hereinafter the same) of 0.1 to 100 g/10 minutes, in particular 0.5 to 50 g/1 minutes is preferably used.

As the above olefin polymer (a), in view of transparency, a crystalline or a low crystallinity α-olefin polymer (c) having the above melting point and storage elastic modulus can be exemplified. The crystalline or the low crystallinity α-olefin polymer (c) is a polymer or a copolymer of an α-olefin having 2 to 10 carbon atoms, and also has a degree of crystallinity as measured by X-ray of 5% or more. A random copolymer of propylene and other α-olefin is preferably used. The α-olefin in said random copolymer includes, for example, an α-olefin having 2 to 10 carbon atoms such as ethylene, 1-butene, 4-methyl-1-pentene, 1-hexene, 1-octene and the like. Among them, ethylene and/or 1-butene are preferable. In the random copolymer, content of the above other α-olefin unit is preferably 10% or more.

Such random copolymer of propylene and other α-olefin can be manufactured by polymerizing propylene or copolymerizing propylene and other α-olefin in the presence of a stereospecific olefin polymerization catalyst comprising a transition metal compound component such as a Ziegler-Natta type transition metal component containing titanium or the like, and a metallocene type transition metal component containing titanium, zirconium, hafnium or the like, a cocatalyst such as an organic aluminium component, and if necessary, an electron donor, a carrier and the like.

[Buffering Layer (B)]

Material constructing the buffering layer (B) is preferably the one superior in flexibility and transparency, and an olefin polymer (d) having a stiffness of 100 MPa or less is suitable.

An example of the olefin polymer (d) is a resin composition (g) having a melting point (softening point) of 75° C. or higher and a storage elastic modulus at 150° C. of $10^3$ Pa or more comprising 50 to 100 parts by weight of an amorphous α-olefin polymer (e) satisfying the following requirements (1) to (3):

(1) a content of polymerization unit based on α-olefin having 3 to 20 carbon atoms is 20 mole % or more;

(2) melting peak based on differential scanning calorimeter is not substantially observed;

(3) Mw/Mn is 5 or less;

and 50 to 0 part by weight of a crystalline α-olefin polymer (f) (total of both polymers is 100 parts by weight).

The above non crystalline α-olefin polymer (e) is a polymer containing a monomer unit based on α-olefin having 3 to 20 carbon atoms of 20 mole % or more, and preferably 30 mole % or more relative to the total content of all monomer units of 100 mole %. When the above monomer content is too low, the polymer could be inferior in transparency and bleeding resistance. In particular, in view of heat resistance and transparency, a polymer having a content of propylene unit of 30 mole % or more, preferably 50 mole % or more, and particularly preferably 80 mole % or more is preferably used. Specific examples of the above α-olefin having 3 to 20 carbon atoms include a linear α-olefin such as propylene, 1-butene, 1-pentene, 1-hexene, 1-heptene, 1-octene, 1-nonene, 1-decene, 1-undecene, 1-dodecene, 1-tridecene, 1-tetradecene, 1-pentadecene, 1-hexadecene, 1-heptadecene, 1-octadecene, 1-nanodecene, 1-eicosene and the like; a branched α-olefin such as 3-methyl-1-butene, 3-methyl-1-pentene, 4-methyl-1-pentene, 2-ethyl-1-hexene, 2,2,4-trimethyl-1-pentene and the like; and the like, and these α-olefins can be used in combination of 2 types.

The non crystalline α-olefin polymer (e) may contain a monomer unit based on a monomer other than the α-olefin having 3 to 20 carbon atoms, and said monomer includes, for example, ethylene, a polyene compound, a cyclic olefin, a vinyl aromatic compound and the like. Content of said monomer unit is desirably 70 mole % or less, preferably 50 mole % or less, and particularly preferably 20 mole % or less, relative to the total content of all monomer units in the amorphous α-olefin polymer of 100 mole %.

The amorphous α-olefin polymer is preferably a propylene homopolymer, a propylene-ethylene copolymer, a propylene-α-olefin other than propylene copolymer, and a propylene-α-olefin having 4 or more carbon atoms-ethylene copolymer, more preferably a propylene homopolymer, a propylene-ethylene copolymer, a propylene-1-butene copolymer, a propylene-1-hexene copolymer, a propylene-ethylene-1-butene copolymer, and a propylene-ethylene-1-hexene copolymer, further more preferably a propylene homopolymer, a propylene-1-butene copolymer, and a propylene-ethylene-1-butene copolymer, and most preferably a propylene homopolymer or a propylene-1-butene copolymer. The above polymers may be used alone or in combination of 2 or more types.

The non crystalline α-olefin polymer (e) is a polymer on which no peak of melting is practically observed by a differential scanning calorimeter (DSC). The polymer, wherein a peak of melting is observed, could be inferior in transparency. Further, as the amorphous α-olefin polymer (d), the one having a molecular weight distribution (Mw/Mn), which is a ratio of weight average molecular weight to number average molecular weight as measured by a gel permeation chromatography using the standard polystyrene as a standard substance for molecular weight, of 5 or less, and preferably 1 to 4 is used. Use of the polymer having too large molecular distribution could result in inferior in bleeding resistance, transparency and the like.

The amorphous α-olefin polymer (e) having the above properties can be manufactured by a slurry polymerization process, a solution polymerization process, a bulk polymerization process, a gas-phase polymerization process or the like using a metallocene type catalyst. As a particularly preferable example of the manufacturing process using a metallocene catalyst, the process disclosed in the description of WO Application No. 1211287 can be exemplified.

In the above resin composition (g), the crystalline α-olefin polymer (f) which can be used together with the amorphous α-olefin polymer (e) is a polymer or a copolymer of α-olefin having 2 to 10 carbon atoms, which has a degree of crystallinity as measured by X-ray of 30% or more. In view of compatibility to the amorphous α-olefin polymer (e), transparency, heat resistance and the like, a propylene homopolymer or a random copolymer of propylene and a small content of other α-olefin is preferably used. α-olefin in said random copolymer includes, for example, an α-olefin having 2 to 10 carbon atoms such as ethylene, 1-butene, 4-methyl-1-pentene, 1-hexene, 1-octene and the like. Among them, ethylene and/or 1-butene are preferable. In the random copolymer, content of the above other α-olefin is preferably 10% by weight or less. Also, as the above propylene homopolymer or the random copolymer of propylene, in view of heat resistance, the one having a peak of melting based on a differential scanning calorimeter (DSC) of 120 to 170° C., in particular 150 to 170° C. is preferable.

Such propylene homopolymer or a random copolymer of propylene and a small content of other α-olefin can be manufactured by polymerizing propylene or copolymerizing propylene and other α-olefin, in the presence of a stereospecific olefin polymerization catalyst comprising a transition metal compound component such as a Ziegler-Natta type transition metal component containing titanium or the like, and a metallocene type transition metal component containing titanium, zirconium, hafnium or the like, a cocatalyst such as an organic aluminium component, and if necessary an electron donor, carrier, and the like.

The above resin composition (g) comprises 50 to 100 parts by weight, preferably 60 to 99 parts by weight, further preferably 70 to 95 parts by weight of the above amorphous α-olefin polymer (e) and 50 to 0 parts by weight, preferably 40 to 1 part by weight, and further preferably 30 to 5 parts by weight of the crystalline α-olefin polymer (f) (total content of (e) and (f) is 100 parts by weight). Also, as the resin composition (g), the one having a peak of melting (based on a differential scanning calorimeter) of 120 to 170° C., and preferably 150 to 170° C. due to the crystalline α-olefin polymer (e) is preferable.

The above olefin copolymer (d) is selected from an ethylene-vinyl acetate copolymer, an ethylene-unsaturated carboxylate ester copolymer, an ethylene-unsaturated carboxylic acid copolymer, an ionomer thereof, and an amorphous or a low crystallinity α-olefin copolymer, and the one having the hardness described above can be used. For example, an ethylene-vinyl acetate copolymer in which content of vinyl acetate unit is around 10 to 40% by weight, and an ethylene-acrylate ester copolymer or an ethylene-methacrylate ester copolymer in which content of acrylate ester unit or methacrylate ester unit is around 15 to 40% by weight are preferably used. Alternatively, a copolymer composed of ethylene, acrylic acid or methacrylic acid, and acrylate ester or methacrylate ester, or an ionomer thereof in which content of acrylic acid or methacrylic acid polymerization unit is 4 to 30% by weight, and content of acrylate ester or methacrylate ester polymerization unit is 1 to 30% by weight can be used.

As another suitable example of the above olefin copolymer (d), an ethylene-unsaturated carboxylate ester copolymer in which content of unsaturated carboxylate ester unit is 10 to 40% by weight, and preferably 15 to 30% by weight, and a melting point (T° C.) (according to JIS K 7121-1987 or ISO 3146) and a content (X mole %) of unsaturated carboxylate ester unit satisfy the following formula:

$$-3.0X+125 \geq T \geq -3.0X+109$$

can be exemplified. As the above unsaturated carboxylate ester, an acrylate ester or a methacrylate ester is preferable. As specific examples of the ethylene-unsaturated carboxylate ester copolymer, an ethylene-acrylate ester copolymer or an ethylene-methacrylate ester copolymer such as ethylene-methyl acrylate copolymer, ethylene-ethyl acrylate copolymer, ethylene-methyl methacrylate copolymer, ethylene-isobutyl acrylate copolymer, and ethylene-n-butyl acrylate copolymer can be exemplified. Also, as the ethylene-unsaturated carboxylate ester copolymer, in view of molding processability, mechanical strength and the like, the one having a melt flow rate at 190° C. under a load of 2,160 g is 0.1 to 100 g/10 minutes, particularly 0.5 to 50 g/10 minutes is preferably used. The above polymer, which has a higher melting point for the content of unsaturated carboxylate ester unit in comparison with a usual sufficiently random copolymer, can be manufactured, for example, by conducting multistage polymerization using the autoclave method or the tubular method in the high pressure radical polymerization process. Examples of these manufacturing processes include the processes disclosed in each official gazette of JP-A-62-273214 and JP No. 3423308. When the protective material in the solar cell module is polycarbonate or acrylic resin, a desired adhesive strength is possibly obtained by using the ethylene-unsaturated carboxylate ester copolymer as described above even without using a silane coupling agent.

As the olefin polymer constructing the adhesive and heat resistant layer (A), an olefin polymer containing a cross-linking agent can be used. Preferable examples of the olefin polymer containing a cross-linking agent include an ethylene copolymer composition (h) containing a cross-linking agent. As the ethylene copolymer (h-1) to be used in the ethylene copolymer composition (h), the one having a storage elastic modulus at 150° C. of $10^3$ Pa or more after cross-linking is preferable. Further, in view of transparency, adhesiveness and the like, an ethylene-polar monomer copolymer (i) is preferably used. As the polar monomer of said copolymer (i), one type or two or more types of a vinyl ester such as vinyl acetate and vinyl propionate; an unsaturated carboxylate ester such as methyl acrylate, ethyl acrylate, isopropyl acrylate, isobutyl acrylate, n-butyl acrylate, isooctyl acrylate, methyl methacrylate, isobutyl methacrylate, dimethyl maleate and the like; an unsaturated carboxylic acid such as acrylic acid, methacrylic acid, fumaric acid, itaconic acid, monomethyl maleate, monoethyl maleate, maleic anhydride, itaconic anhydride and the like; a salt of these unsaturated carboxylic acids; carbon monoxide; sulfur dioxide; and the like can be exemplified. The salt of the unsaturated carboxylic acid includes a salt of monovalent metal such as lithium, sodium and potassium and the like; a salt of polyvalent metal such as magnesium, calcium, zinc and the like; and the like.

More specifically as a suitable ethylene-polar monomer copolymer (i), an ethylene-vinyl ester copolymer such as ethylene-vinyl acetate; an ethylene-unsaturated carboxylate ester copolymer such as ethylene-methyl acrylate copolymer, ethylene-ethyl acrylate copolymer, ethylene-methyl methacrylate copolymer, ethylene-isobutyl acrylate copolymer and ethylene-n-butyl acrylate copolymer; an ethylene-unsaturated carboxylic acid copolymer such as ethylene-acrylic acid copolymer, ethylene-methacrylic acid copolymer, ethylene-isobutyl acrylate-methacrylic acid copolymer; and an ionomer thereof; and the like can be exemplified as a representative example. In particular, a suitable ethylene-polar monomer copolymer (i) is ethylene-vinyl acetate and ethylene-unsaturated carboxylate ester copolymer.

Suitable content of the polar monomer unit in the ethylene-polar monomer copolymer slightly varies depending on its type. For example, in the case of ethylene-vinyl acetate copolymer or ethylene-unsaturated carboxylate ester copolymer, in view of heat resistance, adhesiveness, flexibility, moldability, endurance, insulating property and the like, content of vinyl acetate unit or unsaturated carboxylate ester unit is 10 to 40% by weight, preferably 15 to 30% by weight, and in the case of ethylene-unsaturated carboxylate ester copolymer or the ionomer thereof, content of ethylene unit is 65 to 95% by weight, and preferably 70 to 90% by weight, content of unsaturated carboxylic acid unit is 2 to 20% by weight, and preferably 5 to 20% by weight, content of vinyl acetate unit, unsaturated carboxylate ester unit, or other unit as an optional copolymer component is 0 to 40% by weight, and preferably 0 to 30% by weight, and degree of neutralization is 90% or less, and preferably 80% or less.

As such ethylene-polar monomer copolymer, in view of molding processability, mechanical strength and the like, the one having a melt flow rate at 190° C. under a load of 2,160 g of 0.1 to 100 g/10 minutes, and particularly 0.5 to 50 g/10 minutes is preferably used. These ethylene-vinyl acetate copolymer, ethylene-unsaturated carboxylate ester copolymer and ethylene-unsaturated carboxylic acid copolymer can be obtained by the radical copolymerization at high temperature under high pressure. In addition, the ionomer of ethylene-unsaturated carboxylic acid copolymer can be obtained by reacting the ethylene-unsaturated carboxylic acid copolymer with a metal compound.

As the cross-linking agent to be compounded in the ethylene copolymer composition (h), an organic peroxide having a decomposition temperature (a temperature at which half life is 1 hour) of 70 to 180° C., and particularly 90 to 160° C. is preferably used. Such organic peroxide includes, for example, t-butylperoxyisopropyl carbonate, t-butyl peroxyacetate, t-butyl peroxybenzoate, dicumyl peroxide, 2,5-dimethyl-2,5-bis(t-butylperoxy)hexane, di-t-butyl peroxide, 2,5-dimethyl-2,5-bis(t-butylperoxy)hexyne-3,1,1-bis(t-butylperoxy)-3,3,5-trimethylcyclohexane, 1,1-bis(t-butylperoxy)cyclohexane, methyl ethyl ketone peroxide, 2,5-dimethylhexyl-2,5-bisperoxybenzoate, t-butyl hydroperoxide, p-menthane hydroperoxide, benzoyl peroxide, p-chlorobenzoyl peroxide, t-butyl peroxyisobutylate, hydroxyheptyl peroxide, cyclohexanone peroxide and the like. Suitable amount of the cross-linking agent to be compounded varies depending on type of the cross-linking agent, but a ratio of 0.1 to 5 parts by weight, and particularly 0.5 to 3 parts by weight relative to 100 parts by weight of the ethylene copolymer (b-1) is effective.

In the above ethylene copolymer composition (h), an cross-linking aid can be compounded together with cross-linking agent. As a specific example of the cross-linking aid, a polyunsaturated compound such as polyallyl compound and poly(meth)acryloxy compound can be exemplified. More specifically, the cross-linking aid includes a polyallyl compound such as triallyl isocyanurate, triallyl cyanurate, diallyl phthalate, diallyl fumarate and diallyl maleate; a poly(meth)acryloxy compound such as ethyleneglycol diacrylate, ethyleneglycol dimethacrylate and trimethylolpropane trimethacrylate; divinylbenzene; and the like. As for amount of the cross-linking aid, a ratio of 5 parts by weight or less, for example, around 0.5 to 5 parts by weight relative to 100 parts by weight of the ethylene copolymer (h-1) is effective.

As another example of the above ethylene copolymer (d), a crystalline or a low crystalline α-olefin-based copolymer can be exemplified. This copolymer is composed of 2 or more types of α-olefin having 2 to 10 carbon atoms, and a copolymer having a degree of crystallinity as measured by X-ray of 40% or less (0 to 40%), and therefore a rubber-like property. A representative example of the copolymer is a copolymer having a composition containing ethylene or propylene as a main component, one or more types of other α-olefins having 2 to 10 carbon atoms as sub-components, and if necessary, a small amount of diene monomer.

The copolymer containing ethylene as a main component includes the one which contains an ethylene polymerization unit of 50 to 90 mole %, and preferably 70 to 85 mole %, an α-olefin polymerization unit other than ethylene of 50 to 10 mole %, and preferably 30 to 15 mole %, and if necessary, a diene monomer polymerization unit of 2 mole % or less, and preferably 1 mole % or less. As such ethylene-based copolymer, an ethylene-propylene copolymer, an ethylene-1-butene copolymer, an ethylene-4-methyl-1-pentene copolymer, an ethylene-1-hexene copolymer, an ethylene-1-octene copolymer, an ethylene-propylene-dicyclopentadiene copolymer, an ethylene-propylene-5-ethylidene-2-norbornene copolymer, an ethylene-propylene-1,6-hexadiene copolymer and the like can be exemplified. Among them, an ethylene-propylene copolymer, an ethylene-propylene-diene copolymer or an ethylene-1-butene copolymer is particularly preferable.

In addition, as the copolymer containing propylene as a main component, the one which contains a propylene polymerization unit of 70 to 95 mole %, and preferably 72 to 90 mole %, and an α-olefin polymerization unit other than propylene of 5 to 30 mole %, and preferably 10 to 28 mole % can be exemplified. As such propylene-based copolymer, a propylene-ethylene copolymer and a propylene-1-butene copolymer can be exemplified.

As the above non crystalline or low crystalline α-olefin-based copolymer, in view of moldability, mechanical strength and the like, the one having a melt flow rate (MFR) as measured at 230° C. under a load of 2,160 g according to ASTM D-1238 of 0.1 to 50 g/10 minutes, and particularly 0.5 to 20 g/10 minutes is preferably used.

The above non crystalline or low crystalline α-olefin-based copolymer, when it is a copolymer containing ethylene as a main component, can be manufactured by copolymerizing ethylene and other α-olefins in the presence of a vanadium type catalyst composed of a soluble vanadium compound and an organic aluminium halide, or a metallocene type catalyst composed of a metallocene compound such as zirconium compound and the like coordinated with cyclopentadienyl group or the like and an organic aluminium oxy compound. Also, when the copolymer contains propylene as a main component, the non crystalline or low crystalline α-olefin-based copolymer can be manufactured by copolymerizing propylene and other α-olefins in the presence of a stereospecific olefin polymerization catalyst containing a transition metal compound component such as a high-activity titanium catalyst component, a metallocene type catalyst component or the like, an organic aluminium component, and if necessary, an electron donor, a carrier and the like.

In the above adhesive and heat resistant layer (A) and buffering layer (B), various types of additives may be each optionally compounded. As such additives, specifically cross-linking agent, silane coupling agent, ultraviolet absorbing agent, hindered phenol type or phosphite type antioxidant, hindered amine type photostabilizer, light diffusing agent, flame retardant, discoloration inhibitor and the like can be exemplified. As the cross-linking agent, the one exemplified as those which can be compounded in the ethylene copolymer composition (h) can be used. As the silane coupling agents, the one exemplified as those which can be compounded in the olefin copolymer (a) or the ethylene copolymer composition (h) can be used. For example, when high priority is put on adhesive strength to the solar cell element or the lower protective material, compounding of the silane coupling agent in the buffering layer (B) is effective, but when reuse of the solar cell element is assumed, the silane coupling agent need not to be compounded because of the reason described before. In this case, if a cross-linking agent is compounded in the buffering layer (B), releasability of the solar cell element could be rather improved due to enhanced cohesion of the resin layer by the cross-linking.

The ultraviolet absorbing agent which can be added to each layer includes various types of agent such as benzophenone type, benzotriazole type, triazine type, salicylate ester type and the like. The benzophenone type ultraviolet absorbing agent includes, for example, 2-hydroxy-4-methoxybenzophenone, 2-hydroxy-4-methoxy-2'-carboxybenzophenone, 2-hydroxy-4-octoxybenzophenone, 2-hydroxy-4-n-dodecyloxybenzophenone, 2-hydroxy-4-n-octadecyloxybenzophenone, 2-hydroxy-4-benzyloxybenzophenone, 2-hydroxy-4-methoxy-5-sulfobenzophenone, 2-hydroxy-5-chlorobenzophenone, 2,4-dihydroxybenzophenone, 2,2'-dihydroxy-4-methoxybenzophenone, 2,2'-dihydroxy-4,4'-dimethoxybenzophenone, 2,2',4,4'-tetrahydroxybenzophenone and the like.

The benzotriazole type ultraviolet absorbing agent is a hydroxyphenyl-substituted benzotriazole compound, and includes, for example, 2-(2-hydroxy-5-methylphenyl)benzotriazole, 2-(2-hydroxy-5-t-butylphenyl)benzotriazole, 2-(2-hydroxy-3,5-dimethylphenyl)benzotriazole, 2-(2-methyl-4-hydroxyphenyl)benzotriazole, 2-(2-hydroxy-3-methyl-5-t-butylphenyl)benzotriazole, 2-(2-hydroxy-3,5-di-t-amylphenyl)benzotriazole, 2-(2-hydroxy-3,5-di-t-butylphenyl) benzotriazole and the like. Also, the triazine type ultraviolet absorbing agent includes 2-[4,6-bis(2,4-dimethylphenyl)-1,3,5-triazine-2-yl]-5-(octyloxy)phenol, 2-(4,6-diphenyl-1,3,5-triazine-2-yl)-5-(hexyloxy)phenol and the like. The salicylate ester type includes phenyl salicylate, p-octylphenyl salicylate and the like.

Using the encapsulating material for solar cell of the present invention, a solar cell module can be manufactured by fixing a solar cell element with upper and lower protective materials. As such solar cell module, various types can be exemplified. For example, the one having such structure that a solar cell element is sandwiched from both sides thereof with encapsulating material in such manner as upper transparent protective material/encapsulating material/solar cell element/encapsulating material/lower protective material; the one having such structure that an encapsulating material and an upper transparent protective material are formed on a solar cell element which is formed on the inner surface of a lower substrate protective material; the one having such structure that an encapsulating material and a lower protective material are formed on a solar cell element which is formed on the inner surface of an upper transparent protective material, for example, an amorphous solar cell element formed on a fluorinated-resin-based protective material by sputtering or the like; and the like. In the structures as described above, the encapsulating material for solar cell of the present invention is used in such manner that layer (A) is in contact with the upper and/or lower protective material and the buffering layer (B) is in contact with the solar cell element, respectively. Preferably, total thickness of the encapsulating material for solar cell is around 0.25 to 1.5 mm, thickness of the adhesive and heat resistant layer (A) is around 0.2 to 1.2 mm, thickness of the buffering layer (B) is around 0.05 to 0.6 mm, and ratio of thicknesses of the adhesive and heat resistant layer (A) to the buffering layer (B) ([A]/[B]) is around 1/3 to 20/1.

As the solar cell element, various types of solar cell elements, for example, silicon type such as single crystal silicon, polycrystalline silicon, amorphous silicon and the like; III-V groups or II-VI groups compounds semiconductor type such as gallium-arsenic, copper-indium-selenium, cadmium-tellurium and the like; and the like can be used.

As the upper protective material constructing the solar cell module, glass, acrylic resin, polycarbonate, polyester, fluorine-containing resin and the like can be exemplified. The lower protective material is a sheet of simple body or multilayer such as a metal and various types of thermoplastic resin films, and for example, a single layer or a multilayer of protective material of metal such as tin, aluminium, stainless steel and the like; inorganic material such as glass and the like; polyester; polyester vapor-evaporated with inorganic substance; fluorine-containing resin; polyolefin; and the like can be exemplified. Such upper and/or lower protective material can be applied with a primer treatment for increasing adhesiveness with the encapsulating material. The encapsulating material for solar cell of the present invention exhibit superior adhesiveness to these upper or lower protective materials.

The encapsulating material for solar cell of the present invention is used usually in a form of sheet. In this case, prior to manufacturing of the solar cell module, a sheet-like encapsulating material of the present invention composed of 2 layers can be prepared in advance. Alternatively, each layer of sheet (or film) is prepared, which can be laminated when the solar cell module is manufactured. These sheets (films) can be manufactured by the known molding process using a single layer or a multilayer T-die extruder, a calendaring apparatus or the like. For example, these sheets (films) can be obtained by dry blending a resin component and additives to be added if necessary such as silane coupling agent, ultraviolet absorbing agent, antioxidant, photostabilizer and the like in advance, feeding the mixture from the hopper of a T-die extruder, then extruding in a sheet-like form. In the dry blending, a part of or all of the additives can be used in a form of master-batch. In addition, in the T-die extrusion or calendaring, a resin composition, which is obtained by, melt blending a resin component with a part of or all of the additives using single-screw extruder, twin-screw extruder, Banbury mixer, kneader and the like in advance, can be used.

In the manufacturing of the solar cell module, the module having the aforementioned structure can be formed by the similar method to the conventional one, in which a multilayer sheet-like encapsulating material prepared in advance, or overlapped sheets (or films) corresponding to each layer are pressure-bonded at a temperature at which the encapsulating material melts. In the encapsulating material of the present invention, when an olefin polymer (a) having a melting point of 75° C. or higher and a storage elastic modulus at 150° C. of $10^3$ Pa or more is used as the adhesive and heat resistant layer (A), sheet-forming of the encapsulating material can be conducted at a high temperature productively because the encapsulating material need not contain an organic peroxide, and also the module-forming can be completed at a high temperature in a short time because cross-linking step need not be employed in forming the module.

EXAMPLES

Hereinafter, the present invention will be further explained in detail referring to Examples, however, the present invention is not limited by these Examples in any way.

It should be noted that the raw materials and evaluation methods for physical properties used in Examples are as follows.
1. Raw Materials
EVA: Ethylene-vinyl acetate copolymer (content of vinyl acetate unit: 25% by weight, melt flow rate (190° C., under a load of 2,160 g): 2.0 g/10 minutes).
EMAA: Ethylene-methacrylic acid copolymer (content of methacrylic acid unit: 15% by weight, melt flow rate (190° C., under a load of 2,160 g): 25 g/10 minutes).

EMA: Ethylene-methyl acrylate copolymer (content of methyl acrylate unit: 30% by weight (12.2 mole %), melt flow rate (190° C., under a load of 2,160 g): 3.0 g/10 minutes, melting point (JIS K 7121): 85° C.).

IO: Zinc ionomer of ethylene-methacrylic acid copolymer (content of methacrylic acid unit: 15% by weight) (degree of neutralization: 23 mole %, melt flow rate (190° C., under a load of 2,160 g): 5.0 g/10 minutes).

Amorphous PP composition: a resin composition composed of 85 parts by weight of amorphous polypropylene polymer and 15 parts by weight of crystalline polypropylene (trade name: Tofcelen T3512, produced by Sumitomo Chemical Co., Ltd.).

EPR: ethylene-propylene copolymer (trade name: Tafmer P0275, produced by Mitsui Chemicals Inc., melt flow rate (190° C., under a load of 2,160 g): 2.5 g/10 minutes).

PBR: propylene-butane copolymer (trade name: Toughmer XR110T, produced by Mitsui Chemical Co., Ltd., melt flow rate (190° C., under a load of 2,160 g): 3.2 g/10 minutes).

Silane coupling agent: N-β-(aminoethyl)-γ-aminopropyl trimethoxysilane (trade name: KBM 603, produced by Shin-Etsu Chemical Co., Ltd.).

Silane coupling agent: γ-methacryloxypropyl trimethoxysilane (trade name: KBM 503, produced by Shin-Etsu Chemical Co., Ltd.).

Organic Peroxide: 2,5-dimethyl-2,5-bis(tertiary-butylperoxy) hexane (trade name: Lupersol 101, produced by Arkema Yoshitomi, Ltd.).

Ultraviolet absorbing agent: Tinuvin UV1164 (produced by Ciba Specialty Chemicals Inc.).

Photostabilizer: Tinuvin 622LD (produced by Ciba Specialty Chemicals Inc.), Sanol LS770 (produced by Sankyo Co., Ltd.).

Antioxidant: Irganox 1010 (produced by Ciba Specialty Chemicals Inc.).

2. Making a Sheet and Measurements of Physical Properties

Using an atypical extruder (40 mm, L/D=26), 0.4 mm thick sheets for layer (A) and 0.2 mm thick sheets for layer (B) were made at a processing temperature adjusted as appropriate depending on a melting point and a flow property of each polymer within a range from 110 to 180° C., and their physical properties were measured. Results are collectively shown in Table 1. In each sheet, Tinuvin UV1164 (0.3 parts), Sanol LS770 (0.15 parts), Tinuvin 622LD (0.15 parts) or Irganox 1010 (0.03 parts) were added, respectively as a weather-resistant stabilizer.

TABLE 1

| Layer used | Sample No. | Composition | Melting Point* (° C.) | Storage Elastic Modulus (Pa) | Stiffness (MPa) |
|---|---|---|---|---|---|
| (A) | 1 | EMAA + KBM603 (0.5 wt %) | 93 | $1.0 \times 10^5$ | 83 |
| (A) | 2 | IO + KBM603 (0.5 wt %) | 91 | $1.8 \times 10^5$ | 180 |
| (A) | 3 | PBR + KBM503 (0.2 wt %) | 110 | $1.1 \times 10^5$ | 320 |
| (B) | 4 | EMA | 85 | | 8 |
| (B) | 5 | EVA + Lupasol101 (1.2%) + KBM (0.1 wt %) | 77 | | 15 |
| (B) | 6 | Amorphous PP Composition | 158 | | 5 |
| (B) | 7 | EPR | 30 | | 24 |
| (B) | 8 | EVA | 77 | | 15 |

*: according to JIS K7121-1987

In this connection, storage elastic modulus was measured using the following instrument under the following conditions.

Instrument: DVE-V4 FT-Rheospectrer (produced by Rheology Corp.);

Conditions: Tensile mode, sheet thickness: 2 mm, frequency: 10 Hz, amplitude: 2 μm, sine wave, temperature rising speed: 3° C./minute, measurement temperature: 150° C.

Examples 1 to 8

A layer (A) and a layer (B) of the sample Number shown in Table 2 in combination were overlapped between two 3 mm thick glass plates, and lamination was performed under the conditions of 150° C.×15 minutes (180° C.×15 minutes in Examples 4 and 7) using a vacuum laminator. HAZE and all light transmittance of the resultant laminated bodies were measured using a hazemeter (produced by Suga Test Instruments Co., Ltd.) according to JIS K7105. Results are collectively shown in Table 2. Every laminated body exhibited superior transparency as HAZE of 10% or less or all light transmittance of 80% or more.

TABLE 2

| | Layer A Sample No. | Layer B Sample No. | Difference in stiffness (MPa) | HAZE (%) | All light transmittance (%) |
|---|---|---|---|---|---|
| Example 1 | 2 | 4 | 172 | 3.3 | 86.6 |
| Example 2 | 2 | 6 | 175 | 3.8 | 80.3 |
| Example 3 | 1 | 8 | 68 | 2.8 | 86.1 |
| Example 4 | 1 | 7 | 59 | 6.0 | 86.6 |
| Example 5 | 1 | 6 | 78 | 4.9 | 82.2 |
| Example 6 | 1 | 4 | 75 | 3.7 | 86.1 |
| Example 7 | 3 | 5 | 305 | 8.5 | 82.1 |

In addition, each of sample No.s 1, 2 and 3 for layer (A) was placed on a 3 mm thick glass, and lamination was performed using a vacuum laminator under the conditions of 150° C.×15 minutes to evaluate adhesive strength to glass (Sample No. 3 was aged at 85° C. for 3 days).

Adhesive strengths were 25 N/10 mm for sample No. 1, 30 N/10 mm for sample No. 2 and 4 N/10 mm for sample No. 3.

As the endurance test, aging tests were conducted under the conditions of 120° C.×500 hours and 85° C.×90% RH×700 hours, and variations in YI (variations to the initial value) were observed. Samples with a structure of glass/layer A/layer B/backsheet were prepared by conducting lamination under the conditions of 150° C.×5 minutes. Results are shown in Table 2. Even after the aging test at 120° C., variations of YI were 10 or less.

TABLE 3

| | 120° C. × 500 hours | 85° C. × 90% RH × 500 hours |
|---|---|---|
| Example 1 | 6.8 | 0.3 |
| Example 2 | 3.8 | 0.4 |
| Example 3 | 6.8 | 0 |
| Example 4 | 8.8 | −0.3 |
| Example 5 | 6 | 0.2 |
| Example 6 | 7.8 | 0 |
| Example 7 | 4.5 | −0.3 |

What is claimed is:

1. An encapsulating material for solar cell comprising an adhesive and heat resistant layer (A) and a buffering layer (B), wherein the adhesive and heat resistant layer (A) and the buffering layer (B) are laminated to form a two-layered laminate and a difference in stiffness between the adhesive and heat resistant layer (A) and the buffering layer (B) is at least 30 MPa or more, wherein the adhesive and heat resistant layer (A) comprises an olefin polymer (a) having a melting point of 75° C. or higher and a storage elastic modulus at 150° C. of $10^3$ Pa or more, wherein the buffering layer (B) comprises an olefin polymer (d) having a stiffness of 100 MPa or less, which is selected from the group consisting of: (i) a resin composition (g) comprising 50 to 100 parts by weight of an amorphous α-olefin polymer (e) satisfying the following requirements (1) to (3):

(1) a content of polymerization unit based on α-olefin having 3 to 20 carbon atoms is 20 mole % or more;
(2) melting peak of melting based on differential scanning calorimeter is not substantially observed;
(3) Mw/Mn is 5 or less;

and 50 to 0 part by weight of a crystalline α-olefin polymer (f), wherein a total of both polymers (e) and (f) is 100 parts by weight, and (ii) an ethylene-unsaturated carboxylate ester copolymer containing 10 to 30% by weight of unsaturated carboxylate ester unit having a melting point (T° C.) and a content (X mole %) of unsaturated carboxylate ester unit which satisfy the following formula:

$$-3.0X+125 \geq T \geq -3.0X+109,$$

wherein the adhesive and heat resistant layer (A) is for contacting with a protective material, and the buffering layer (B) is for contacting with a solar cell element.

2. The encapsulating material for solar cell according to claim 1, wherein a silane coupling agent is compounded in the olefin polymer (a).

3. The encapsulating material for solar cell according to claim 1, wherein said olefin polymer (a) is an ethylene-polar monomer copolymer (b).

4. The encapsulating material for solar cell according to claim 3, wherein the ethylene-polar monomer copolymer (b) is an ethylene-unsaturated carboxylic acid copolymer in which content of unsaturated carboxylic acid unit is 4% by weight or more or an ionomer thereof.

5. The encapsulating material for solar cell according to claim 1, wherein the olefin polymer (a) is a crystalline α-olefin polymer (c).

6. The encapsulating material for solar cell according to claim 5, wherein said α-olefin polymer (c) is a homopolymer or a copolymer of an α-olefin having 2 to 10 carbon atoms and a degree of crystallinity as measured by X-ray is 5% or more.

7. The encapsulating material for solar cell according to claim 5, wherein said α-olefin polymer (c) is a random copolymer of propylene and other α-olefin.

8. The encapsulating material for solar cell according to claim 1, wherein said olefin copolymer (d) is an olefin copolymer (d) containing a cross-linking agent.

9. The encapsulating material for solar cell according to claim 1, wherein said olefin copolymer (d) is an olefin copolymer (d) containing a silane coupling agent.

10. The encapsulating material for solar cell according to claim 1, wherein said material is a sheet.

11. A solar cell module obtainable by encapsulating a solar cell element with the encapsulating material for solar cell according to claim 1 in such manner that the adhesive and heat resistant layer (A) side is in contact with the protective material and the buffering layer (B) side is in contact with the solar cell element.

12. The solar cell module according to claim 11, wherein an adhesive strength between the adhesive and heat resistant layer (A) and the protective material is 3 N/10 mm or more.

13. The encapsulating material for solar cell according to claim 1, wherein the olefin polymer (a) is a low crystalline α-olefin copolymer comprising at least two α-olefin having 2 to 10 carbon atoms and a degree of crystallinity of 40% or less.

* * * * *